US011991900B2

(12) United States Patent
Xu et al.

(10) Patent No.: US 11,991,900 B2
(45) Date of Patent: May 21, 2024

(54) ORGANIC LIGHT EMITTING DIODE DISPLAY

(71) Applicant: BenQ Materials Corporation, Taoyuan (TW)

(72) Inventors: Wei-Feng Xu, Taoyuan (TW); Cyun-Tai Hong, Taoyuan (TW); Chen-Kuan Kuo, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 445 days.

(21) Appl. No.: 17/324,152

(22) Filed: May 19, 2021

(65) Prior Publication Data

US 2021/0273204 A1     Sep. 2, 2021

Related U.S. Application Data

(63) Continuation-in-part of application No. 16/558,186, filed on Sep. 2, 2019, now abandoned.

(51) Int. Cl.
| | |
|---|---|
| *G02F 1/295* | (2006.01) |
| *G02B 5/18* | (2006.01) |
| *G02B 5/30* | (2006.01) |
| *G02B 6/26* | (2006.01) |
| *G02B 6/34* | (2006.01) |
| *G02B 6/42* | (2006.01) |
| *G02F 1/29* | (2006.01) |
| *H10K 50/86* | (2023.01) |

(52) U.S. Cl.
CPC ........... *H10K 50/86* (2023.02); *G02B 5/1814* (2013.01); *G02B 5/1866* (2013.01); *G02B 5/3083* (2013.01); *G02B 5/3025* (2013.01)

(58) Field of Classification Search
CPC .. G02B 5/3058; G02B 5/1814; G02B 5/1866; G02B 5/3083; G02B 5/3025; G02B 5/3016; G02B 5/1852; H01L 51/5281; H10K 50/86; H10K 50/858
See application file for complete search history.

(56) References Cited

U.S. PATENT DOCUMENTS

| | | | | |
|---|---|---|---|---|
| 5,658,490 | A | * 8/1997 | Sharp | G02F 1/13363 349/96 |
| 9,727,772 | B2 | * 8/2017 | Popovich | G02B 5/1828 |
| 10,216,061 | B2 | * 2/2019 | Popovich | H01L 27/14625 |
| 10,802,356 | B2 | * 10/2020 | Harrold | G06F 3/0445 |
| 2002/0171793 | A1 | * 11/2002 | Sharp | G02F 1/13471 349/117 |

(Continued)

FOREIGN PATENT DOCUMENTS

| | | | |
|---|---|---|---|
| CN | 109283730 A | 1/2019 | |
| KR | 20160105852 A | * 9/2016 | ............... G03H 1/02 |

*Primary Examiner* — Mary A Wilczewski
*Assistant Examiner* — Tsz K Chiu

(57) ABSTRACT

An organic light emitting diode display is provided. The organic light emitting diode display comprises an organic light emitting diode panel, a quarter-wavelength retarder disposed on the organic light emitting diode panel, a polarizer disposed on the quarter-wavelength retarder, an adhesive layer disposed on the polarizer and a diffraction grating film adhered to the polarizer by the adhesive layer. The diffraction grating film comprises a substrate and a first diffraction grating layer comprising a plurality of first gratings aligned with a first direction disposed on the substrate.

10 Claims, 8 Drawing Sheets

(56) References Cited

U.S. PATENT DOCUMENTS

| | | | |
|---|---|---|---|
| 2003/0179990 A1* | 9/2003 | Weber | G02B 6/2931 385/27 |
| 2009/0213298 A1* | 8/2009 | Mimura | G02B 6/0053 349/67 |
| 2010/0002296 A1* | 1/2010 | Choi | G02B 27/281 359/485.01 |
| 2012/0268745 A1* | 10/2012 | Kudenov | G01J 3/0208 356/453 |
| 2013/0278544 A1* | 10/2013 | Cok | G06F 3/0445 200/600 |
| 2013/0301126 A1* | 11/2013 | Du | G02B 27/285 359/485.07 |
| 2014/0022619 A1* | 1/2014 | Woodgate | G02B 27/0093 359/240 |
| 2015/0355490 A1* | 12/2015 | Kao | G02F 1/13338 349/12 |
| 2016/0216540 A1* | 7/2016 | Cho | G02F 1/13471 |
| 2017/0097515 A1* | 4/2017 | Bell | H04N 13/395 |
| 2018/0284417 A1* | 10/2018 | Deisseroth | G02B 21/0012 |
| 2018/0321553 A1* | 11/2018 | Robinson | G02B 6/0076 |
| 2021/0033898 A1* | 2/2021 | Woodgate | G02F 1/13471 |

* cited by examiner

ORGANIC LIGHT EMITTING DIODE DISPLAY

This application claims the benefit of Taiwanese application serial No. 108104007, filed on Feb. 1, 2019, and the benefit of U.S. application Ser. No. 16/558,186, filed on Sep. 2, 2019, the subject matters of which are incorporated herein by reference.

BACKGROUND OF THE INVENTION

Field of the Invention

The invention relates in general to an organic light emitting diode display, and more particularly relates to an organic light emitting diode display for reducing color-shift at wide viewing angles.

Description of the Related Art

The organic light emitting diode displays are expected to become mainstream display products in the future due to the advantages of self-luminescence, wide viewing angles, fast response time, high brightness, high luminous efficiency, low operating voltage, thin thickness and flexibility.

The organic light emitting diodes can be distinguished into a top emitting mode and a bottom emitting mode organic light emitting diode according to different light-emitting directions, and have a reflective electrode and a semi-transparent electrode, so that the excitation light can generate different degrees of micro-resonant cavity effect in the light-emitting diode. Especially for the top emitting mode organic light emitting diode which is commonly used for obtaining better luminous efficiency, the semi-transparent electrode can reflect light multiple times and is more likely to form a micro-resonant cavity effect, so as to have better light coherence and color purity. However, the intensity and wavelength of the light emitted by the organic light-emitting diode are therefore highly dependent on the emitting angle of light, Therefore, in the case that the gap of each of the electrodes cannot be individually regulated with the wavelength of light emitted from each organic material and the desired emitting angle of light, when the angle increases, the spectrum of light emitted by the organic light emitting diode display will shift toward a shorter wavelength, which is the blue shift phenomenon in the micro-resonant cavity effect. Because the brightness emitted from the red and blue sub-pixels decreases faster than the brightness emitted from the green sub-pixels, the white color images displayed by the organic light emitting diode display appear to be greenish at large angles, and result in a color-shift problem at wide viewing angles.

In the prior art, there is a structure that combines a half-wave retarder, a quarter-wavelength retarder, and a positive C-plate (+C-plate) to improve the color-shift problem of the organic light emitting diode display at large-viewing angles. However, the wavelength dispersion of the existing organic light emitting materials cannot satisfy the ideal reverse dispersion in all visible light bands, and the positive C-plate materials with reverse dispersion property are difficult to develop and expensive.

Therefore, the present invention discloses an organic light emitting diode display, which can avoid the color-shift problem at large viewing angles, thereby improving image quality.

SUMMARY OF THE INVENTION

The present invention provides an organic light emitting diode display that can improve the color-shift problem at large viewing angles. In an aspect of the organic light emitting diode display of present invention, the organic light emitting diode display comprises an organic light emitting diode panel, a quarter-wavelength retarder disposed on the organic light emitting diode panel, a polarizer disposed on the quarter-wavelength retarder, and a diffraction grating film disposed on the polarizer comprising a substrate and a first diffraction grating layer formed on the substrate, wherein the first diffraction grating layer includes a plurality of first gratings aligned with a first direction.

In an embodiment of the organic light emitting diode display of present invention, the pitch of each of the first gratings is independently in a range of 0.38 μm to 8.95 μm.

In another embodiment of the organic light emitting diode display of the present invention, the duty ratio of the first diffraction grating layer is in a range of 0.27 to 0.73.

In another embodiment of the organic light emitting diode display of present invention, the height of each of the first gratings is independently in a range of 0.1 μm to 3.6 μm.

In another embodiment of the organic light emitting diode display of the present invention, the diffraction grating film further comprises a second diffraction grating layer formed on the first diffraction grating layer, and the second diffraction grating layer includes a plurality of second gratings aligned with a second direction.

In another embodiment of the organic light emitting diode display of the present invention, the first diffraction grating layer has a first curable resin with a first refraction index n1, and the second diffraction grating layer has a second curable resin with a second refraction index n2, and n1 and n2 are different.

In another embodiment of the organic light emitting diode display of the present invention, the first direction and the second direction intersect at an angle between 0° and 90°.

In another embodiment of the organic light emitting diode display of present invention, the retardation of the first diffraction grating layer is in a range of 0.68 rad to 2.9 rad.

In another aspect of the organic light emitting diode display of the present invention, the difference between n1 and n2 is in the range of 0.1 to 0.3.

In another aspect of the organic light emitting diode display of the present invention, the organic light emitting diode display further comprises a half-wave retarder disposed between the quarter-wavelength retarder and the polarizer.

In another aspect of the organic light emitting diode display of the present invention further comprises a functional layer formed on the substrate, wherein the functional layer is selected from one of a group consisting of a hard-coating layer, an anti-reflective layer and an anti-glaring layer or combinations thereof.

The above and other aspects of the invention will become better understood with regard to the following detailed description of the preferred but non-limiting embodiment(s). These and other aspects of the invention will become apparent from the following description of the presently preferred embodiments. The detailed description is merely illustrative of the invention and does not limit the scope of the invention, which is defined by the appended claims and equivalents thereof. As would be obvious to one skilled in the art, many variations and modifications of the invention may be affected without departing from the spirit and scope of the novel concepts of the disclosure.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

In the following description, numerous specific details are described in detail in order to enable the reader to fully understand the following examples. However, embodiments of the present invention may be practiced in case no such specific details. In other cases, in order to simplify the drawings the structure of the apparatus known only schematically depicted in figures.

Figure 1:
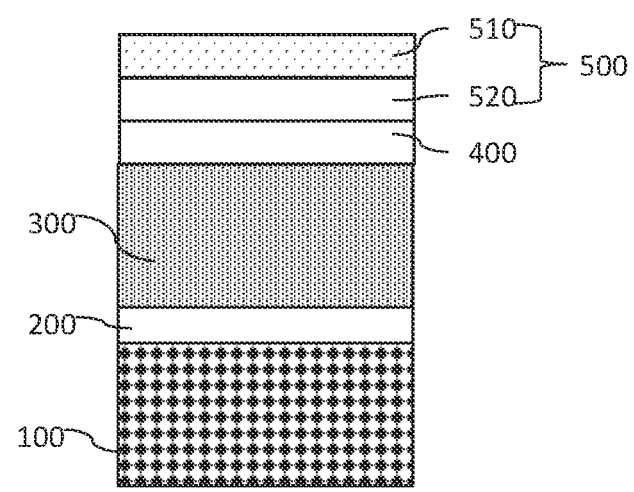
FIG. 1 is a cross-sectional view of an organic light emitting diode display of an embodiment of the present invention.

Please refer to FIG. 1, which is a cross-sectional view of an organic light emitting diode display according to an embodiment of the invention. The organic light emitting diode display of the present invention can improve the problem of color-shift at wide viewing angles. In a preferred embodiment of the present invention as shown in FIGS. 1, the organic light emitting diode display comprises an organic light emitting diode panel 100, a quarter-wavelength retarder 200 disposed on the organic light emitting diode panel 100, a polarizer 300 disposed on the quarter-wavelength retarder 200, an adhesive layer 400 disposed on the polarizer 300, and a diffraction grating film 500.

The basic structure of the organic light diode display panel 100 is composed of an organic material layer sandwiched between a thin and transparent semiconductor indium tin oxide (ITO) as an anode, and a highly reflective or semi-transmissive metal cathode. The organic material layer includes a hole-transport layer (HTL), an emitting layer (EL), and an electron-transport layer (ETL). When a suitable voltage is supplied, the holes injected into the anode and the electrons from the cathode combine in the emitting layer to excite the organic material to generate light. The organic light emitting diode panel 100 of the present invention is, for example but not limited to, the organic light emitting diode panel of the prior art.

The quarter-wavelength retarder 200 is positioned on the organic light-emitting diode panel 100. The quarter-wavelength retarder 200 can be prepared, for example, by coating a polymeric liquid crystal material on a transparent polymer film, orienting it in a planar alignment, and thermal or light curing to orient.

The polarizer 300 is positioned on the quarter-wavelength retarder 200. The polarizer 300 can be a polarizer known in the related art without special limitations. The polarizer 300 can comprise an extended polymer film having a dichroic dye that is absorbed and aligned thereon. The kind of the polymer film forming the polarizer is not particularly limited as long as they can be dyed by a dichroic material such as iodine, and may include, for example, a hydrophilic polymer film, for example, a polyvinyl alcohol film, an ethylene-vinyl acetate copolymer film, an ethylene-vinyl alcohol copolymer film, a cellulose film, and/or a partially saponified film thereof, or a polyene alignment film, for example, a dehydrated polyvinyl alcohol film, a dechlorinated polyvinyl alcohol film, or the like. Considering the dyeing efficiency for the dichroic material, in a preferred embodiment of the present invention, the polymer film is a polyvinyl alcohol film. The polarizer 300 can be produced by any method known in the art, for example, by a process such as swelling, dyeing, crosslinking, stretching, etc., and the manufacturing sequence or number of processes is not particularly limited. The polarizer 300 may be provided with a protective film (not shown) on at least one surface thereof as needed.

The adhesive layer 400 is formed on the polarizer 300 for adhering the diffraction grating film 500 to the polarizer 300. The adhesive layer 400 may be, for example but not limited to, an acrylic resin, a silicon resin, a polyurethane resin, an epoxy resin, or combinations thereof.

The diffractive grating film 500 includes a substrate 510 and a first diffraction grating layer 520 formed on the substrate 510.

In an embodiment of the present invention, the substrate 510 may be made of polyethylene terephthalate (PET), polycarbonate (PC), triacetate cellulose (TAC), polymethyl methacrylate (PMMA) or cyclic olefin polymer (COP), and the thickness thereof can range from 30 μm to 300 μm.

Figure 2:
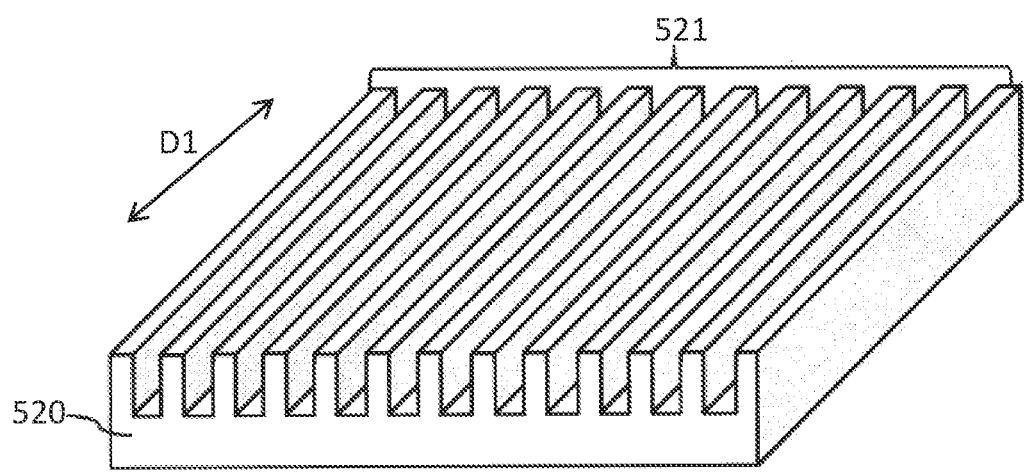
FIG. 2 is a stereoscopic perspective view of a first diffraction grating layer of an embodiment of the present invention.
Figure 3:
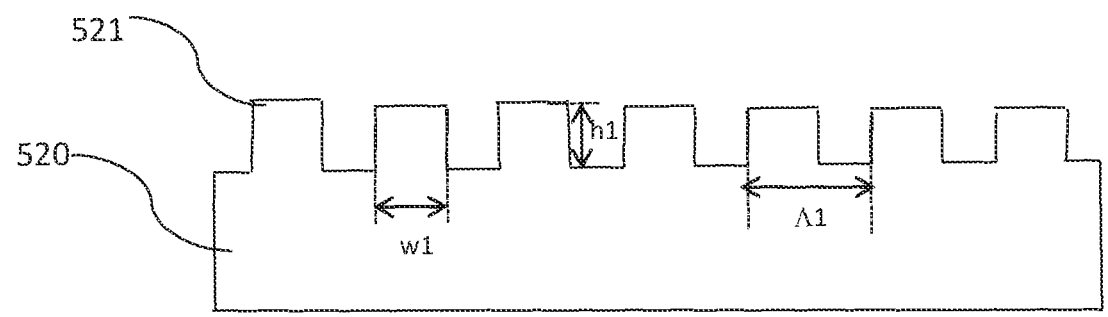
FIG. 3 is a cross-sectional view of the embodiment of the first diffraction grating layer shown in FIG. 2.

Referring to FIG. 2 and FIG. 3 simultaneously, the first diffraction grating layer 520 has a plurality of first gratings 521 aligned with a first direction D1, and the first gratings 521 can be obtained by first embossing a first curable resin (not shown) having a first refractive index n1 on the substrate 510 and curing thereafter. The first curable resin (not shown) may be a photo-curable resin or a thermo-curable resin, and the first refractive index n1 is between 1.4 and 1.7. The first curable resin (not shown) may be, for example, an acrylic resin, a silicon resin, a polyurethane resin, an epoxy resin, or a combination thereof. In an embodiment of the invention, the retardation of the first diffraction grating layer 520 is between 0.68 rad and 2.9 rad. Alternatively, the first direction D1 of the first gratings 521 may be parallel to the absorption axis (not shown) of the polarizer 300, but is not limited thereto.

The dimensions of the first gratings 521 can be determined by the requirements of different organic light emitting diode panels 100. As shown in FIG. 3, each of the first gratings 521 on the first diffraction grating layer 520 may have a pitch Λ1 of 0.38 μm to 8.95 μm, a height h1 of 0.1 μm to 3.6 μm, and a duty ratio (width w1/pitch Λ1) ranging from 0.27 to 0.73. The first gratings 521 on the first diffraction grating layer 520 may have the same or different sizes, and may be sequentially or randomly formed on the surface of the first diffraction grating layer 520.

Figure 4:
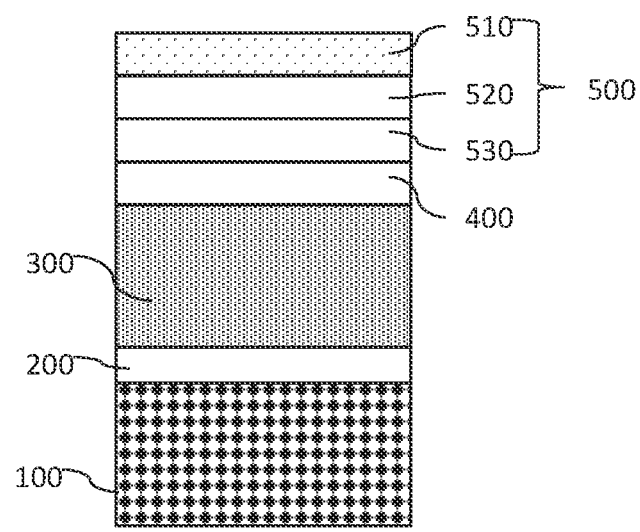
FIG. 4 is a cross-sectional view of an organic light emitting diode display of another preferred embodiment of the present invention.
Figure 5:
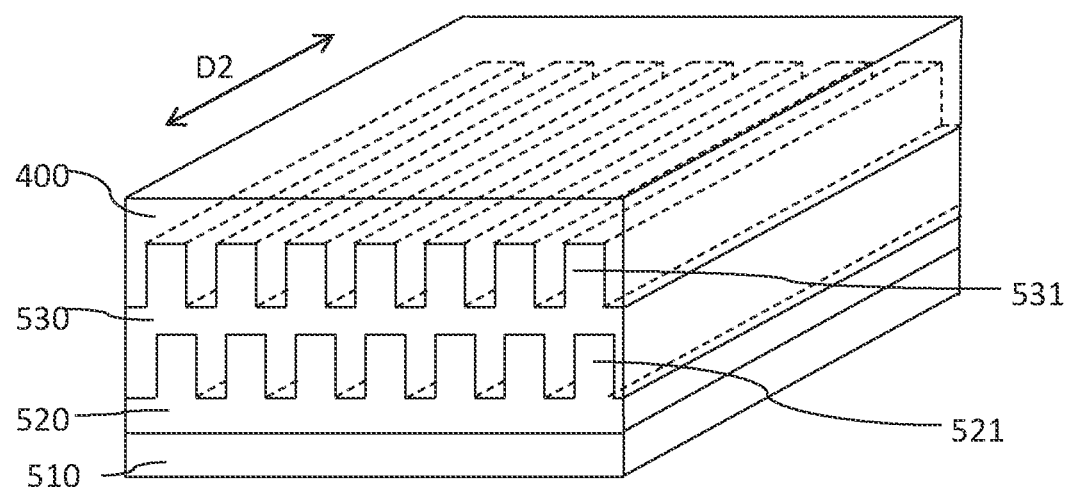
FIG. 5 is a stereoscopic perspective view of a diffraction grating film of a preferred embodiment of the present invention.
Figure 6:
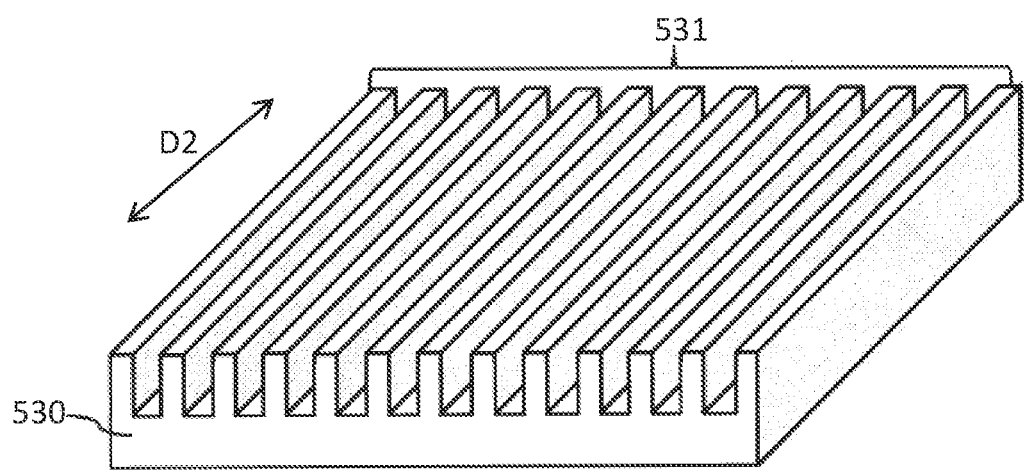
FIG. 6 is a stereoscopic perspective view of a second diffraction grating layer of an embodiment of the present invention.

Referring to FIG. 4 and FIG. 5, in a preferred embodiment of the present invention, the diffraction grating film 500 further includes a second diffraction grating layer 530 formed on the first diffraction grating layer 520. The second diffraction grating layer 530 includes a plurality of second gratings 531 aligned with a second direction D2. The second grating 531 can be obtained by first embossing a second curable resin (not shown) having a second refractive index n2 formed on the first diffraction grating layer 520 and curing thereafter, wherein the first direction D1 intersects the second direction D2 at an angle between 0° and 90° as shown in FIG. 6. The second curable resin (not shown) may be a photo-curable resin or a thermo-curable resin. The second curable resin (not shown) may be, for example, an acrylic resin, a silicon resin, a polyurethane resin, an epoxy resin, or a combination thereof. The second refractive index n2 is between 1.4 and 1.7, and the first refractive index n1 and the second refractive index n2 are different. In a preferred embodiment of the present invention, the difference between n1 and n2 is not less than 0.1 and not more than 0.3. Alternatively, the first direction D1 in which the first gratings 521 extend or the second direction D2 in which the second gratings 531 extend may be parallel to the absorption axis (not shown) of the polarizer 300, but is not limited thereto. In an embodiment of the invention, the retardation of the second diffraction grating layer 530 is between 0.68 rad and 2.9 rad.

Figure 7:
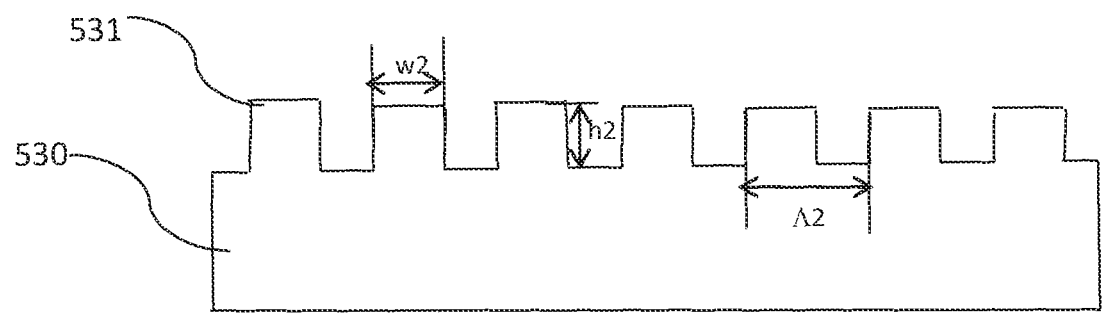
FIG. 7 is a cross-sectional view of the embodiment of the second diffraction grating layer shown in FIG. 6.

The dimensions of the second gratings 531 can be determined by the requirements of different organic light emitting diode panels 100 and the first grating 521 to be matched. Referring to FIG. 6 and FIG. 7, each of the second gratings 531 on the second diffraction grating layer 530 has a pitch $\Lambda 2$ of 0.38 μm to 8.95 μm, a height h2 of 0.1 μm to 3.6 μm, and a duty ratio (width w2/pitch $\Lambda 2$) ranging from 0.27 to 0.73. The second gratings 531 on the second diffraction grating layer 530 may have the same or different sizes, and may be sequentially or randomly formed on the surface of the second diffraction grating layer 530.

In an embodiment of the present invention, the adhesive layer 400 may include a third curable resin having a third refractive index n3, and the third curable resin may be a photo-curable resin or a thermo-curable resin consisting of, for example, an acrylic resin, a silicon resin, a polyurethane resin, an epoxy resin, or a combination thereof. The third refractive index n3 is between 1.4 and 1.7, and the difference between n2 and n3 is not less than 0.1 and not more than 0.3. In other embodiments of the present invention, n2 is greater than n1 and n3, and n1 and n3 may be the same or different.

The first diffraction grating layer 520 and the second diffraction grating layer 530 can be used to improve the color-shift problem of the organic light emitting diode panel at a large viewing angle. In addition, the sizes of the first gratings 521 and the second gratings 531, such as the width, the height, the pitch, and the duty ratio, may be independently set to be the same or different sizes according to the overall requirements or product designs of different organic light emitting diode displays. According to an embodiment of the invention, the first gratings 521 on the first diffraction grating layer 520 and the second gratings 531 on the second diffraction grating layer 530 have the same width, height, pitch, and duty ratio. According to another embodiment of the invention, the first gratings 521 on the first diffraction grating layer 520 and the second gratings 531 on the second diffraction grating layer 530 have different width, height, pitch, and duty ratio.

The light emitted by each sub-pixel on the organic light emitting diode panel 100 can pass through the first diffraction grating layer 520 and the second diffraction grating layer 530 respectively, so the light emitted by each sub-pixel can be redirected to the desired angle.

According to another embodiment of the present invention, the organic light emitting diode display further comprises a functional layer 600 formed on the substrate 510 of the diffraction grating film 500. The functional layer 600 can be, for example but not limited to, a hard-coating layer, an anti-reflective layer and an anti-glaring layer, or combinations thereof, as shown in FIG. 8.

Figure 8:
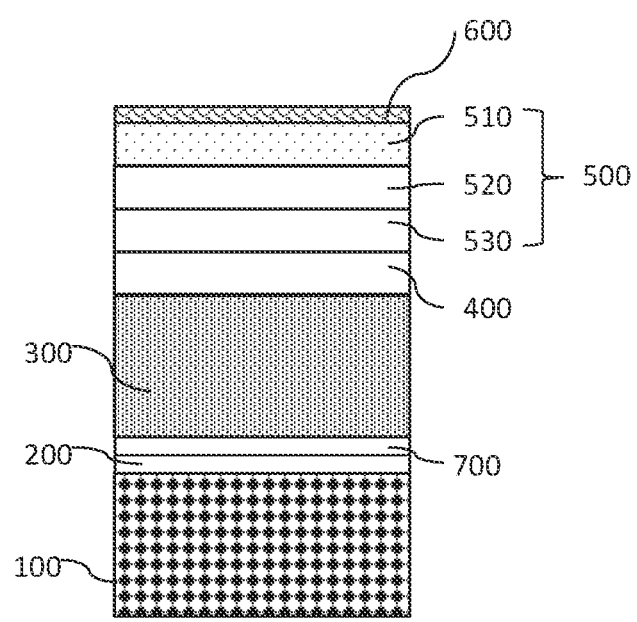
FIG. 8 is a cross-sectional view of an organic light emitting diode display of another embodiment of the present invention.

According to another embodiment of the present invention, the organic light emitting diode display further comprises a half-wave retarder 700 disposed between the quarter-wavelength retarder 200 and the polarizer 300, as shown in FIG. 8.

The following examples are intended to further illustrate the invention, but the invention is not limited thereto.

EXAMPLES

Example 1

The diffraction grating film disclosed in the Example 1 includes a substrate and a first diffraction grating layer having a plurality of first gratings extending along the first direction D1, wherein the first gratings of the first diffraction grating layer have a pitch of 0.45 μm, a height of 0.45 μm, a grating gap of 0.255 μm, and a duty ratio of 0.5. After the diffraction grating film was adhered to an organic light emitting diode display panel (model: Samsung Tab S2), the Autronic-Melcher Conoscope 80 was used to measure the spectrum of red, green and blue light at different viewing angles. Then the amount of the maximum wavelength shift $\Delta\lambda_{peak}$ corresponding to the peak of the luminescence spectrum of the front view and the oblique view is calculated. The measurement results are shown in Table 2.

Example 2

The diffraction grating film disclosed in the Example 2 includes a first diffraction grating layer having a plurality of first gratings extending along a first direction D1, and a second diffraction grating layer having a plurality of second gratings extending along a second direction D2, wherein the first direction and the second direction intersect at an angle of 90°. The duty ratio of the first diffraction grating layer and the second diffraction grating layer is 0.5, which includes a plurality of gratings having different sizes and patterns as shown in Table 1, and the gratings 1 to 11 having different pitches, heights, and grating gaps are sequentially periodically arranged on the first diffraction grating layer and on the second diffraction grating layer. After the diffraction grating film was adhered to an organic light emitting diode display panel (model: Samsung Tab S2), the Autronic-Melcher Conoscope 80 was used to measure the spectrum of red, green and blue light at different viewing angles. Then the amount of the maximum wavelength shift $\Delta\lambda_{peak}$ corresponding to the peak of the luminescence spectrum of the front view and the oblique view is calculated. The measurement results are shown in Table 2.

TABLE 1

Dimensions of gratings on the first diffraction grating layer and the second diffraction grating layer of the diffraction grating film

| Dimensions of gratings | Gratings | | | | | | | | | | |
| --- | --- | --- | --- | --- | --- | --- | --- | --- | --- | --- | --- |
|  | 1 | 2 | 3 | 4 | 5 | 6 | 7 | 8 | 9 | 10 | 11 |
| pitch (μm) | 1.4 | 1.4 | 1.4 | 1.4 | 1.7 | 1.7 | 1.7 | 1.7 | 2.57 | 2.57 | 2.57 |
| height (μm) | 0.9 | 0.9 | 0.9 | 0.9 | 0.9 | 0.9 | 0.9 | 0.9 | 1.0 | 1.0 | 1.0 |
| grating gap (μm) | 0.7 | 0.7 | 0.7 | 0.7 | 0.85 | 0.85 | 0.85 | 0.85 | 1.285 | 1.285 | 1.285 |

Comparative Example 1

The organic light emitting diode display panel (model: Samsung Tab S2) without adhering the diffraction grating film of the present invention was used as the Comparative Example 1, and the spectrum of red, green and blue light at different viewing angles was measured. Then the amount of the maximum wavelength shift $\Delta\lambda_{peak}$ corresponding to the peak of the luminescence spectrum of the front view and the oblique view is calculated. The measurement results are shown in Table 2.

TABLE 2

The amount of the maximum wavelength shift of each color of Example 1, 2 and Comparative Example 1

|  |  | Example 1 | Example 2 | Comparative Example 1 |
| --- | --- | --- | --- | --- |
| Max. $\Delta\lambda_{peak}$ (nm) | red | 9.1 | 7.2 | 9.6 |
|  | green | 12.9 | 9.4 | 22.2 |
|  | blue | 5.0 | 2.0 | 8.1 |

According to the measurement results of Examples 1, 2 and Comparative Example 1, the amounts of wavelength shift of each color at different angles of the organic light emitting diode displays with the diffraction grating films according to the present invention of Example 1 and 2 are both smaller than that of the organic light emitting diode displays without the diffraction grating film according to the present invention. It is obvious that the structure disclosed in the present invention can surely improve the blue-shifting phenomenon of the light emitting diode display at wide viewing angles and therefore can surely reduce the color-shifting problem at wide viewing angles and provide better image quality.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. An organic light emitting diode display comprising:
   an organic light emitting diode panel;
   a quarter-wavelength retarder disposed on the organic light emitting diode panel;
   a polarizer disposed on the quarter-wavelength retarder; and
   a diffraction grating film disposed on the polarizer comprising a substrate and a first diffraction grating layer formed on the substrate, wherein the first diffraction grating layer includes a plurality of first gratings aligned with a first direction, and the retardation of the first diffraction grating layer is in a range of 0.68 rad to 2.9 rad.

2. The organic light emitting diode display according to claim 1, wherein the pitch of each of the first gratings is independently in a range of 0.38 μm to 8.95 μm.

3. The organic light emitting diode display according to claim 1, wherein the duty ratio of the first diffraction grating layer is in a range of 0.27 to 0.73.

4. The organic light emitting diode display according to claim 1, wherein the height of each of the first gratings is independently in a range of 0.1 μm to 3.6 μm.

5. The organic light emitting diode display according to claim 1, wherein the diffraction grating film further comprises a second diffraction grating layer formed on the first diffraction grating layer, and the second diffraction grating layer includes a plurality of second gratings aligned with a second direction.

6. The organic light emitting diode display according to claim 5, wherein the first diffraction grating layer has a first curable resin with a first refraction index n1, and the second diffraction grating layer has a second curable resin with a second refraction index n2, and n1 and n2 are different.

7. The organic light emitting diode display according to claim 6, wherein the difference between n1 and n2 is in the range of 0.1 to 0.3.

8. The organic light emitting diode display according to claim 5, wherein the first direction and the second direction intersect at an angle between 0° and 90°.

9. The organic light emitting diode display according to claim 1 further comprising a half-wave retarder disposed between the quarter-wavelength retarder and the polarizer.

10. The organic light emitting diode display according to claim 1 further comprising a functional layer formed on the substrate, wherein the functional layer is selected from one of a group consisting of a hard-coating layer, an anti-reflective layer and an anti-glaring layer or combinations thereof.

* * * * *